(12) United States Patent
Im et al.

(10) Patent No.: US 12,315,826 B2
(45) Date of Patent: *May 27, 2025

(54) SEMICONDUCTOR DEVICE PACKAGE ASSEMBLIES WITH DIRECT LEADFRAME ATTACHMENT

(71) Applicant: SEMICONDUCTOR COMPONENTS INDUSTRIES, LLC, Scottsdale, AZ (US)

(72) Inventors: Seungwon Im, Bucheon (KR); Oseob Jeon, Seoul (KR)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 18/390,928

(22) Filed: Dec. 20, 2023

(65) Prior Publication Data

US 2024/0250042 A1 Jul. 25, 2024

Related U.S. Application Data

(63) Continuation of application No. 16/680,795, filed on Nov. 12, 2019, now Pat. No. 11,901,309.

(51) Int. Cl.
| | | |
|---|---|---|
| H01L 23/00 | (2006.01) | |
| H01L 21/48 | (2006.01) | |
| H01L 23/31 | (2006.01) | |
| H01L 23/495 | (2006.01) | |

(52) U.S. Cl.
CPC ........ *H01L 23/562* (2013.01); *H01L 21/4839* (2013.01); *H01L 23/49524* (2013.01); *H01L 23/49562* (2013.01); *H01L 23/49575* (2013.01); *H01L 24/50* (2013.01); *H01L 24/86* (2013.01); *H01L 2924/3512* (2013.01)

(58) Field of Classification Search
CPC ............... H01L 23/562; H01L 21/4839; H01L 23/49524; H01L 23/49562; H01L 23/49575; H01L 24/50; H01L 24/86; H01L 2924/3512
See application file for complete search history.

(56) References Cited

U.S. PATENT DOCUMENTS

| | | |
|---|---|---|
| 4,827,376 A | 5/1989 | Voss |
| 5,250,843 A | 10/1993 | Eichelberger |
| 5,612,259 A | 3/1997 | Okutomo et al. |
| 5,673,479 A | 10/1997 | Hawthorne |
| 5,896,651 A | 4/1999 | Hawthorne |

(Continued)

FOREIGN PATENT DOCUMENTS

| | | |
|---|---|---|
| CA | 2080690 C | 10/2001 |
| CN | 101158737 A | 4/2008 |

(Continued)

*Primary Examiner* — Herve-Louis Y Assouman
(74) *Attorney, Agent, or Firm* — Brake Hughes Bellermann LLP

(57) ABSTRACT

In general aspect, a semiconductor device package can include a substrate and a semiconductor die disposed on and coupled with the substrate. The semiconductor device package can further include a leadframe having an indentation defined therein, at least a portion of the indentation being disposed on and coupled with the semiconductor die via a conductive adhesive.

19 Claims, 7 Drawing Sheets

(56) References Cited

U.S. PATENT DOCUMENTS

| | | |
|---|---|---|
| 5,969,413 A | 10/1999 | Yano et al. |
| 6,630,726 B1 | 10/2003 | Crowley et al. |
| 6,849,930 B2 | 2/2005 | Nakajima et al. |
| 8,072,047 B2 | 12/2011 | Camacho et al. |
| 8,084,299 B2 | 12/2011 | Tan et al. |
| 10,199,303 B1 | 2/2019 | Sanchez et al. |
| 11,901,309 B2 * | 2/2024 | Im ................. H01L 24/86 |
| 2004/0157372 A1 | 8/2004 | Manatad |
| 2005/0067676 A1 | 3/2005 | Mahadevan et al. |
| 2007/0090502 A1 | 4/2007 | Zhao et al. |
| 2007/0200210 A1 | 8/2007 | Zhao et al. |
| 2007/0246808 A1 | 10/2007 | Ewe et al. |
| 2007/0262346 A1 | 11/2007 | Otremba et al. |
| 2009/0039485 A1 | 2/2009 | Lee |
| 2009/0102031 A1 | 4/2009 | Almagro et al. |
| 2009/0250795 A1 | 10/2009 | Hooper et al. |
| 2009/0250796 A1 | 10/2009 | Tsui et al. |
| 2011/0081750 A1 | 4/2011 | Machida |
| 2011/0095409 A1 | 4/2011 | Xue et al. |
| 2012/0181676 A1 | 7/2012 | Tsui et al. |
| 2012/0280408 A1 | 11/2012 | Do et al. |
| 2013/0009299 A1 | 1/2013 | Takada et al. |
| 2013/0093072 A1 | 4/2013 | Zhang et al. |
| 2013/0161670 A1 | 6/2013 | Peng |
| 2014/0353818 A1 | 12/2014 | Geitner et al. |
| 2016/0307826 A1 | 10/2016 | McKnight-MacNeil et al. |
| 2016/0343590 A1 | 11/2016 | Yoshihara et al. |
| 2016/0358843 A1 | 12/2016 | Arokiasamy et al. |
| 2017/0033055 A1 | 2/2017 | Watanabe |
| 2017/0317036 A1 | 11/2017 | Myers et al. |
| 2018/0122725 A1 | 5/2018 | Im et al. |
| 2019/0129873 A1 | 5/2019 | Zhao et al. |
| 2019/0259688 A1 | 8/2019 | Scharf et al. |
| 2020/0350238 A1 | 11/2020 | Hong et al. |
| 2021/0013136 A1 | 1/2021 | Cho et al. |
| 2021/0035891 A1 | 2/2021 | Lam et al. |
| 2021/0217679 A1 | 7/2021 | Cheng et al. |
| 2021/0398887 A1 * | 12/2021 | Niendorf ........... H01L 23/49503 |

FOREIGN PATENT DOCUMENTS

| | | |
|---|---|---|
| CN | 103674399 A | 3/2014 |
| CN | 108155157 A | 6/2018 |
| DE | 102009030325 B4 | 5/2014 |
| JP | H10504137 A | 4/1998 |
| JP | 2005085897 A | 3/2005 |
| KR | 20130013075 A | 2/2013 |
| KR | 20170008023 A | 1/2017 |
| RU | 2475885 C1 | 2/2013 |
| WO | 2006000180 A2 | 1/2006 |
| WO | 2013075108 A1 | 5/2013 |
| WO | 2018207856 A1 | 11/2018 |

* cited by examiner

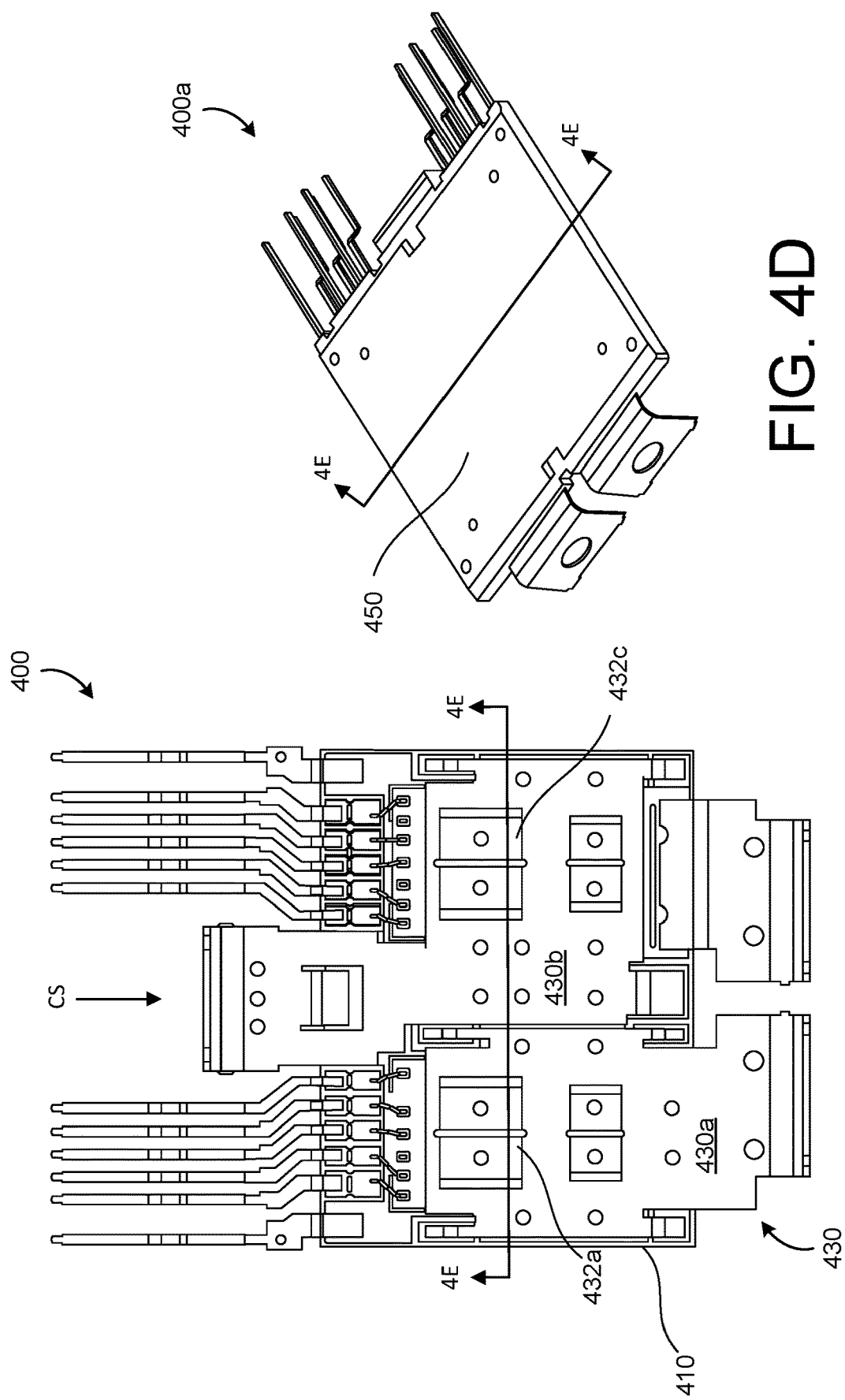

SEMICONDUCTOR DEVICE PACKAGE ASSEMBLIES WITH DIRECT LEADFRAME ATTACHMENT

CROSS-REFERENCE TO RELATED APPLICATION

This application is a continuation application of U.S. patent application Ser. No. 16/680,795, filed Nov. 12, 2019, which is incorporated by reference herein in its entirety.

TECHNICAL FIELD

This description generally relates to semiconductor device package assemblies, such as semiconductor device package assemblies with direct leadframe to semiconductor die attachment.

BACKGROUND

Power semiconductor devices (e.g., multi-chip packages or modules) can be implemented in package apparatus (e.g., semiconductor device packages, packages, modules, multi-chip modules, etc.) that can include multiple substrates, one or more conductive spacers, multiple semiconductor die, and three or more conductive adhesive layers (e.g., solder layers), which can be arranged in a stacked configuration. Tolerance variations of these various package elements, as well as dimension tolerances of assembly process jigs (e.g., soldering jigs) used during an associated manufacturing process, can cause mechanical stress on the elements of the package, e.g., the semiconductor die and/or the substrates. Such mechanical stresses can cause quality and/or reliability issues, such as die cracking and/or substrate (e.g., ceramic) cracking (e.g., which can manifest during the assembly manufacturing process, during reliability stress testing, or as field failures).

Also, in current package implementations, controlling thicknesses of conductive adhesive layers (e.g., solder) to be sufficiently thick (e.g., to reduce thermal-mechanical stresses that can cause die cracks), but also prevent solder overflow (e.g., which can cause undesired electrical shorts in the package, and/or tilting of the semiconductor die), can be difficult. Further, in current stacked package arrangements, cost for materials used in such package can be expensive, particularly the cost of conductive spacers that are formed with materials (e.g., molybdenum copper) that are selected to reduce the incidence of die cracking during, e.g., reliability stress testing or field use.

SUMMARY

In a general aspect, a semiconductor device package can include a substrate and a semiconductor die disposed on and coupled with the substrate. The semiconductor device package can further include a leadframe having an indentation defined therein, at least a portion of the indentation being disposed on and coupled with the semiconductor die via a conductive adhesive.

In another general aspect, a semiconductor device package can include a substrate, a first semiconductor die disposed on and coupled with the substrate and a second semiconductor die disposed on and coupled with the substrate. The semiconductor device package can also include a leadframe including: a first leadframe portion having a first indentation defined therein, a contact surface of the first indentation being disposed on and coupled with the first semiconductor die; and a second leadframe portion having a second indentation defined therein, a contact surface of the second indentation being disposed on and coupled with the second semiconductor die. The contact surface of the first indentation can be coupled with the first semiconductor die and the contact surface of the second indentation can be coupled with the second semiconductor die via a conductive adhesive.

In another general aspect, a method for producing a semiconductor device package can include coupling a semiconductor die with a substrate, and directly coupling an indentation formed in a body of a leadframe with the semiconductor die via a solder material.

The details of one or more implementations are set forth in the accompanying drawings and the description below. Other features will be apparent from the description and drawings, and from the claims.

BRIEF DESCRIPTION OF THE DRAWINGS

FIGS. 4A-4E are diagrams illustrate various views and components of a semiconductor device package assembly.

Figure 1:
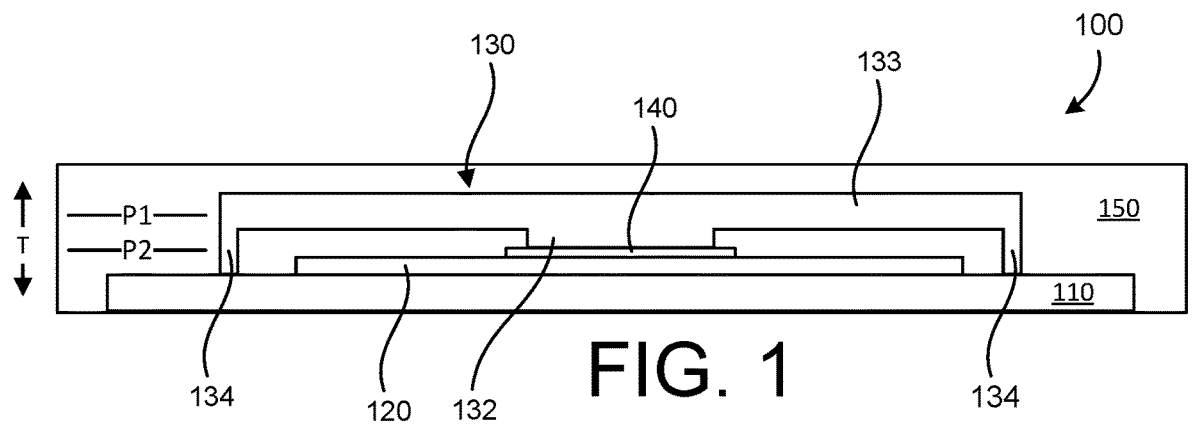
FIG. 1 is a diagram that schematically illustrates a semiconductor device package assembly.

In the drawings, which may not necessarily be to scale, reference numbers for like or similar elements may not be shown for each of those elements. Also, reference numbers from one view of a given implementation may be not be repeated in the related views. Further, in some instances, for purposes of comparing different views, reference numbers from one view of a given implementation may be repeated in other views, but may not be specifically discussed with respect to each view.

DETAILED DESCRIPTION

This disclosure is directed to power semiconductor device package apparatus that can overcome at least some of the drawbacks of current implementations, such as those discussed above. The package apparatus described herein can be used to implement multi-chip devices, such as power semiconductor pairs (e.g., with a high-side power transistor, a low side power transistor, and associated diodes). Of course, the package apparatus described herein can be used to implement other semiconductor devices, such as discrete semiconductor devices, different multi-chip semiconductor devices, etc.

The package apparatus described herein can be implemented using direct lead attachment from a leadframe body to a semiconductor die. For instance, in such approaches, an indentation (dent, recess, depression, dip, indent, etc.) can be formed in a body (e.g., a planar body) of a leadframe. One or more contact surfaces of the indentation can be coupled (direct-lead attached) to a semiconductor die using a conductive adhesive (e.g., a solder). Such indentations can be configured, (such as in the examples described herein) to prevent shorts on a surface of a corresponding semiconductor die due to, e.g., solder overflow, when coupling the leadframe (e.g., the indentations) to the semiconductor die.

In the package apparatus described herein, a leadframe can also include a plurality of buffer legs, where the buffer legs are configured to (e.g., during attachment of the leadframe) mechanically contact the substrate and act as mechanical stops to control a respective heights of a leadframe body and an indentation with respect to a semiconductor die to which the indentation is coupled. Accordingly, a thickness of a conductive adhesive (e.g., a solder bond line thickness (BLT)) between the indentation and an associated semiconductor die can be defined as result of the buffer legs contacting (without being couple to) a substrate on which the semiconductor die is disposed. This can allow for control of an overall stack height of the substrate, the semiconductor die and the leadframe. Further, in conjunction with the indentation, the use of the buffer legs (e.g., by controlling a BLT of associated solder) can prevent electrical shorts resulting from solder overflow, and can also reduce mechanical stresses (as compared to current package apparatus) and, accordingly, prevent die cracking and/or substrate cracking.

Further, in the implementations described herein, the package apparatus exclude a conductive spacer and can include a single substrate. Accordingly, the cost of such packages (e.g., material cost, as well as manufacturing cost) can be reduced as compared to current package apparatus implementations, such as those discussed above FIG. 1 is a diagram that schematically illustrates a semiconductor device package assembly (package) 100. As shown in FIG. 1, the package 100 includes a substrate 110, a semiconductor die 120, a leadframe 130, a conductive adhesive 140 and a molding compound 150. In the package 100, the substrate 110 can be a direct-bonded-metal (DBM) substrate, such a direct-bonded-copper (DBC) substrate, that includes a dielectric layer and patterned metal layers disposed on the dielectric layer (e.g. on opposite surfaces of the dielectric layer). The semiconductor die 120 can be coupled to the substrate 110 (e.g., to a portion of a patterned metal layer of the substrate 110) using a conductive adhesive (not shown in FIG. 1), such as a solder (e.g., a reflowed solder that is solder printed on the substrate 110 prior to disposing the semiconductor die 120 on the substrate 110).

As shown in FIG. 1, the leadframe 130 can include an indentation 132 that is coupled (e.g., directly attached, directly coupled, etc.) with the semiconductor die 120 using the conductive adhesive (e.g., solder) 140. In some implementations, the indentation 132 can be defined (e.g., formed, stamped, etc.) in a planar body 133 of the leadframe 130, such as by bending the planar body 133 to form the indentation 132. That is, the indentation 132 can include (e.g., be defined, at least in part) by a bend.

In the example package 100, the planar body 133 can arranged in a first plane P1 and a contact surface of the indentation 132 (e.g., that is coupled with the semiconductor die 120) can be arranged in a second place P2. In some implementations, such as the implementation of FIG. 1, the second plane P2 can be parallel to, and non-coplanar with the first plane P1 and the contact surface can be a bottom surface of the indentation 132. That is, in the example of FIG. 1, a bottom surface of the indentation 132 (e.g., in the orientation shown in FIG. 1) can define (include, etc.) the contact surface that is coupled with the semiconductor die 120.

In this example, the leadframe 130 also includes a plurality of buffer legs 134 that are configured to contact the substrate 110 and act as mechanical stops for the leadframe 130 when it is being coupled (e.g., soldered) to the semiconductor die 120 and and/or to the substrate 110. The buffer legs 134 can be mechanically independent (e.g., not fixedly coupled to the substrate), such that the buffer legs 134 are able to move on the surface of the substrate 110 (e.g., in response to a force applied to the leadframe (e.g., to the planar body 133) by a solder jig used during a reflow process to couple the indentation 132 with the semiconductor die 120. In other words, the buffer legs 134 can control an amount of travel of the indentation 132 and the planar body 133 of the leadframe 130 along the line T when placed in a soldering jig during a solder reflow operation. Accordingly, the buffer legs can define (establish, etc.) a thickness (BLT, etc.) of the conductive adhesive (e.g., solder) 140 used to couple the indentation 132 with the semiconductor die 120.

Figure 2A:
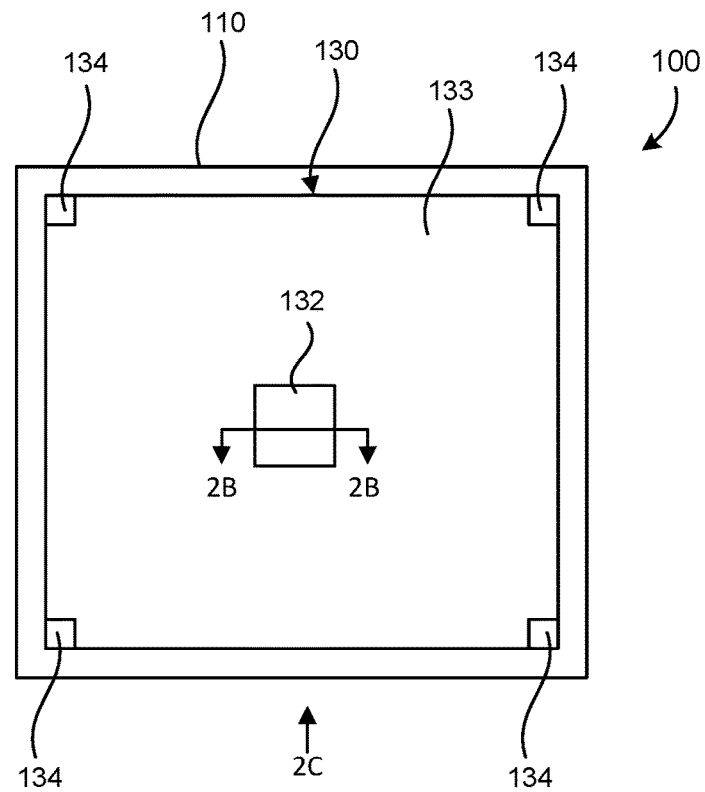
FIGS. 2A through 2C are diagrams that schematically illustrate various views and components of a semiconductor device package assembly.
Figure 2B:
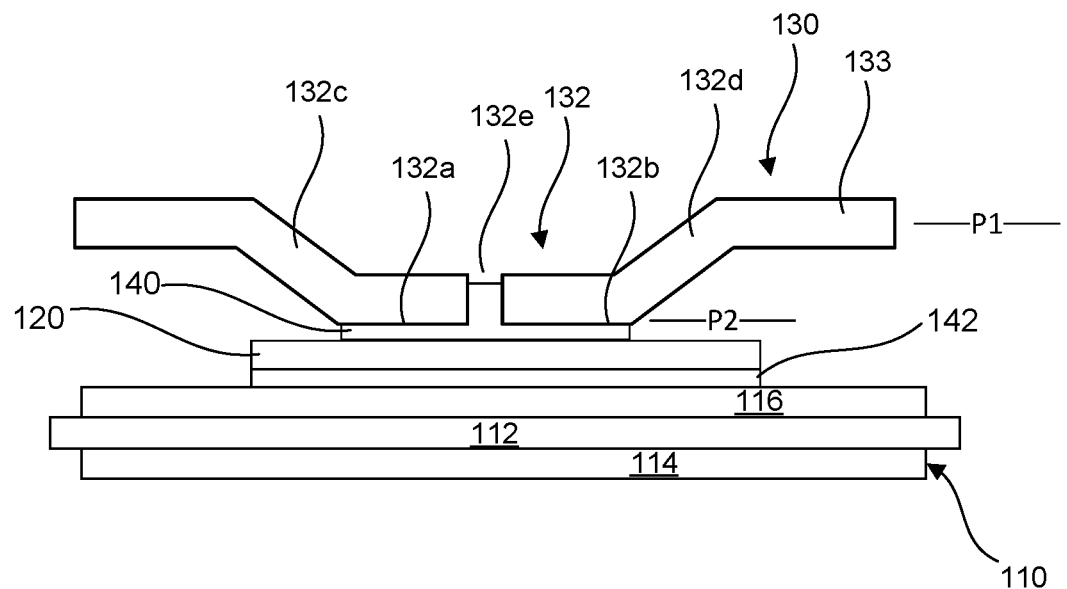
Figure 2C:
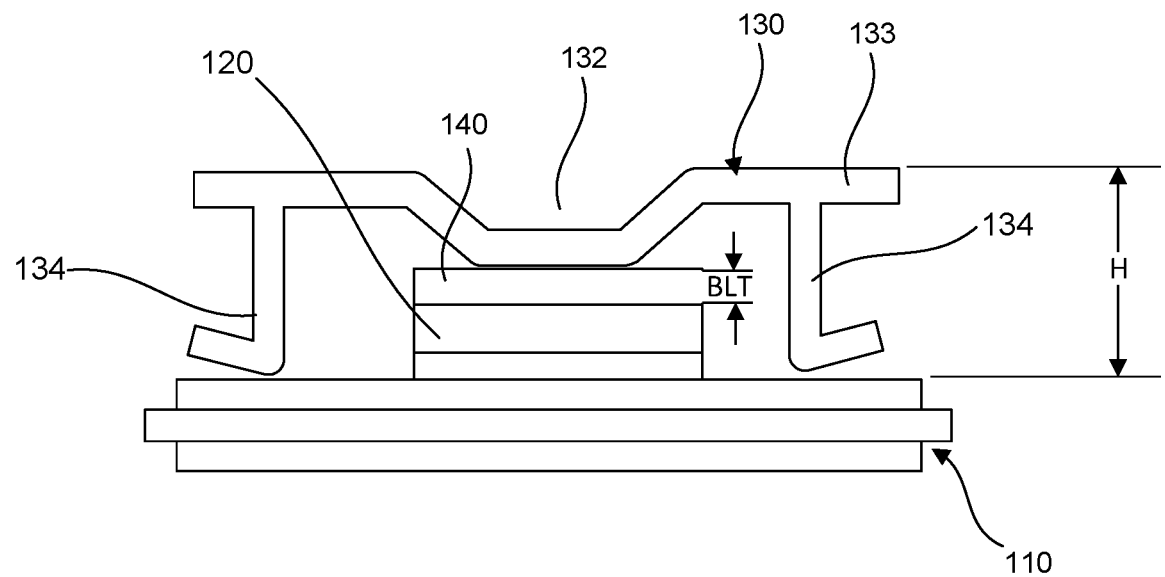

FIGS. 2A through 2C are diagrams that schematically illustrate various views and components of a semiconductor device package assembly, such as the package 100 of FIG. 1. FIG. 2A schematically illustrates a plan (e.g., top side) view of the package 100 of FIG. 1 without the presence of the molding compound 150. FIG. 2B schematically illustrates a cross-sectional view of the package 100 (again, without the molding compound 150) that corresponds with the section line 2B-2B in FIG. 2A. FIG. 2C schematically illustrates a side view of the package 100 of FIG. 2A (yet again, without the molding compound 150) when viewed along a direction indicated by the arrow 2C in FIG. 2A.

Referring to FIG. 2A (with additional reference to FIG. 1), the leadframe 130 is illustrated as being disposed on the semiconductor die 120 (not visible in FIG. 2A) and the substrate 110. In this example, the indentation 132 of the leadframe 130 is defined in the planar body 133 of the leadframe 130 and the indentation 132 can be coupled (directly coupled) with the semiconductor die 120, which is disposed below the indentation 132 and the leadframe 130 (e.g., such as in the arrangement shown in FIG. 1). As is also schematically shown in FIG. 1, the buffer legs 134 can be disposed around a perimeter of the leadframe 130. In some implementation, the buffer legs 134 can be implemented in the leadframe 130 in different arrangements than the arrangement illustrated in FIG. 2A.

Referring to FIG. 2B, a cross-sectional view of the package 100 of FIG. 2A is shown, where the cross-sectional view in FIG. 2B corresponds with the section line 2B-2B shown in FIG. 2A. As illustrated in FIG. 2B, the substrate 110 can be a DBM substrate that includes a dielectric (e.g., ceramic) layer 112, a first (patterned) metal layer 114 disposed on a first side of the dielectric layer, and a second (patterned) metal layer 116 disposed on a second side of the dielectric layer 112. As shown in FIG. 2B, the semiconductor die 120 can be coupled to the metal layer 116 of the substrate 110 using a conductive adhesive (e.g., solder) layer 142 and the indentation 132 can coupled to the semiconductor die (e.g., a transistor, a diode, etc.) 120 using the conductive adhesive (e.g., solder) layer 140.

As further shown in FIG. 2B, the indentation 132 of the leadframe 130 can include a first contact surface 132a and a second contact surface 132b that are arranged in the plane P2 (such as discussed above with respect to FIG. 1), while the planar body 133 of the leadframe 130 is arranged in the plane P1 (which is parallel to, but non-coplanar with the plane P2). In this example, the first contact surface 132a can be included in a first tab of the indentation 132 (e.g., the left side of FIG. 2), while the second contact surface 132b can be included in a second tab of the indentation 132 (e.g., on the right side of FIG. 2B).

In this example implementation, the first tab of the indentation 132 can also include a sloped portion 132c that is disposed between the planar body 133 of the leadframe and the contact surface 132a. The sloped portion 132c can be described as being sloped with respect to the first plane P1, and with respect to the second plane P2. Likewise, the second tab of the indentation 132 can also include a sloped portion 132d that is disposed between the planar body 133 of the leadframe and the contact surface 132b. As with the sloped portion 132c, the sloped portion 132d can be described as being sloped with respect to the first plane P1, and with respect to the second plane P2. As also shown in FIG. 2B, a gap 132e can be defined between the first contact surface 132a and the second contact surface 132b (e.g., between the first tab and the second tab of the indentation). The arrangement of the indentation 132 in FIG. 2B (e.g., the sloped portions 132a and 132b, and the gap 132e), along with the buffer legs 134, as discussed further below, can help prevent undesired shorts on the surface of the semiconductor die, as any excess solder can, e.g., flow into the gap 132e between the contact surfaces 132a and 132b, thus preventing excess solder from causing unwanted shorts on the surface of the semiconductor die 120, or to other elements of the package 100.

Referring to FIG. 2C, a side view of an example implementation of the package 100 of FIG. 2A is shown along the direction 2C. In the example of FIG. 2C, the indentation 132 is shown, as compared to FIG. 2B, without a space 132e between separate contact surfaces, though such a space could be included. FIG. 2C also schematically illustrates buffer legs 134, which can extend from the planar body 133 of the leadframe 130 to the substrate 110 and, when a force is applied to the leadframe 130 by a soldering jig, can act as mechanical stops to control an overall height H of the semiconductor die 120 and the leadframe stack, included the bond line thickness BLT of the conductive adhesive (solder) layer 140 used to coupled the indentation 132 of the leadframe to the semiconductor die 120.

Figure 3:
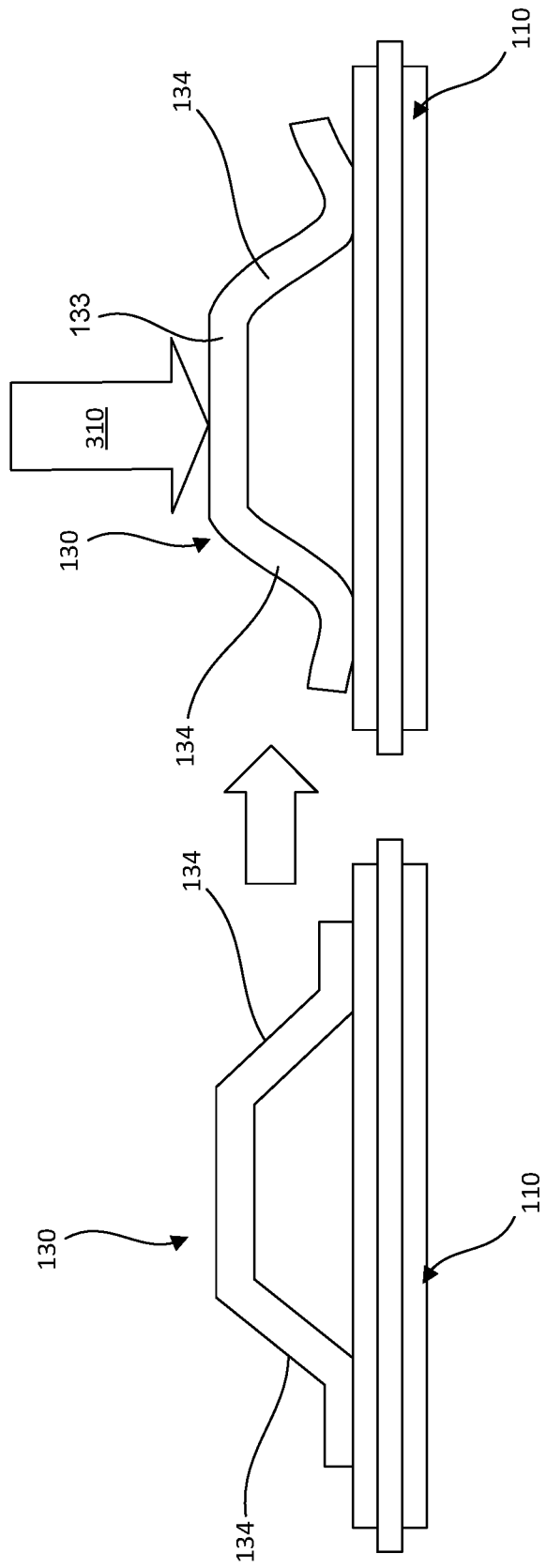
FIG. 3 is a diagram that schematically illustrates operation of buffer legs of a leadframe.

FIG. 3 is a diagram that schematically illustrates operation of buffer legs of a leadframe, such as the buffer legs 134 of the leadframe 130. In the diagram of FIG. 3, an indentation (e.g., the indentations 132) and a semiconductor die (e.g., the semiconductor die 120) are not shown. As discussed herein, the buffer legs 134 and act as mechanical stops for the leadframe by contacting (mechanically contacting) the substrate 110 without being coupled to (e.g., soldered to) the substrate 110. That is, the buffer legs 134 can be mechanically independent from the substrate, such that the buffer legs 134 are able to move with respect to the substrate 110. In FIG. 3, the left side of the diagram illustrates the leadframe 130 disposed on the substrate 110 without any force applied to the leadframe 130 (e.g., by a soldering jig, such as described herein). In comparison with the view shown on the left side of FIG. 3, the right side of FIG. 3 illustrates the leadframe 130 and the buffer legs 134 when a force 310 (e.g., a downward force from a soldering jig) is applied to the leadframe 130. As shown in FIG. 3, when the force 310 is applied, the buffer legs 134 can flex and deflect from the surface of the substrate 110, while controlling vertical movement (e.g., in the direction of the force 310) of the planar body 133 of the leadframe 130, as well as any indentations (e.g., indentation 132) included in the planar body 133 (though indentations are not specifically shown in FIG. 3). Accordingly, the buffer legs 134 can be configured to control spacing (e.g., along the line H in FIG. 2C) begin the semiconductor die 120 and the indentation and accordingly, control a BLT of the conductive adhesive 140, such as the BLT illustrated in FIG. 2C.

Figure 4A:
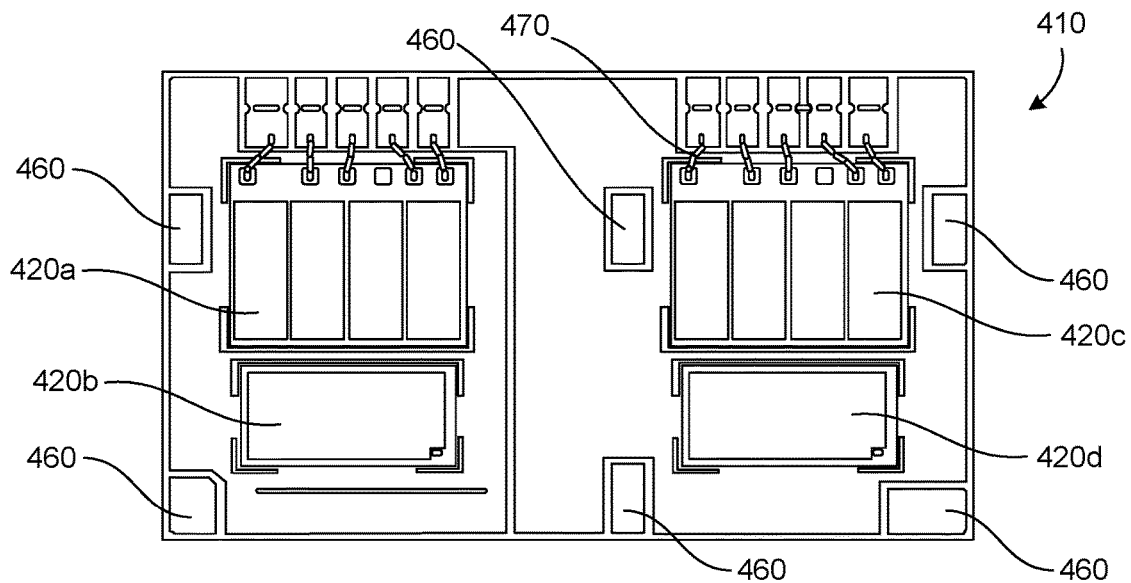
Figure 4B:
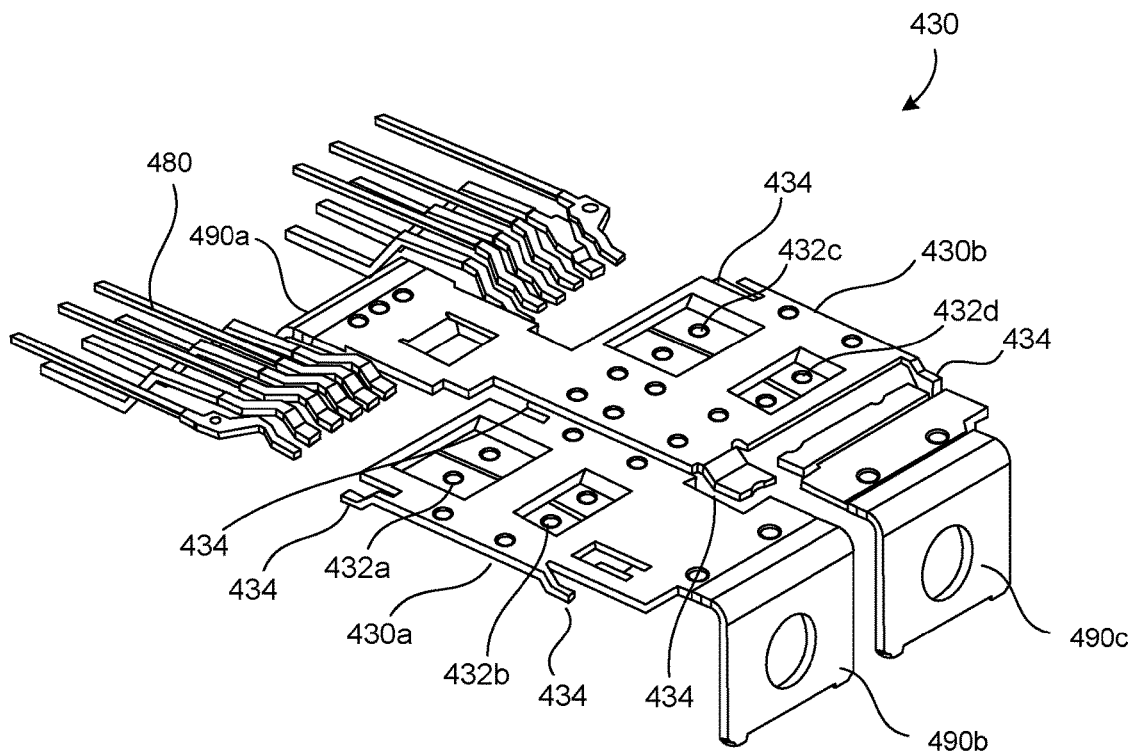
Figure 4E:
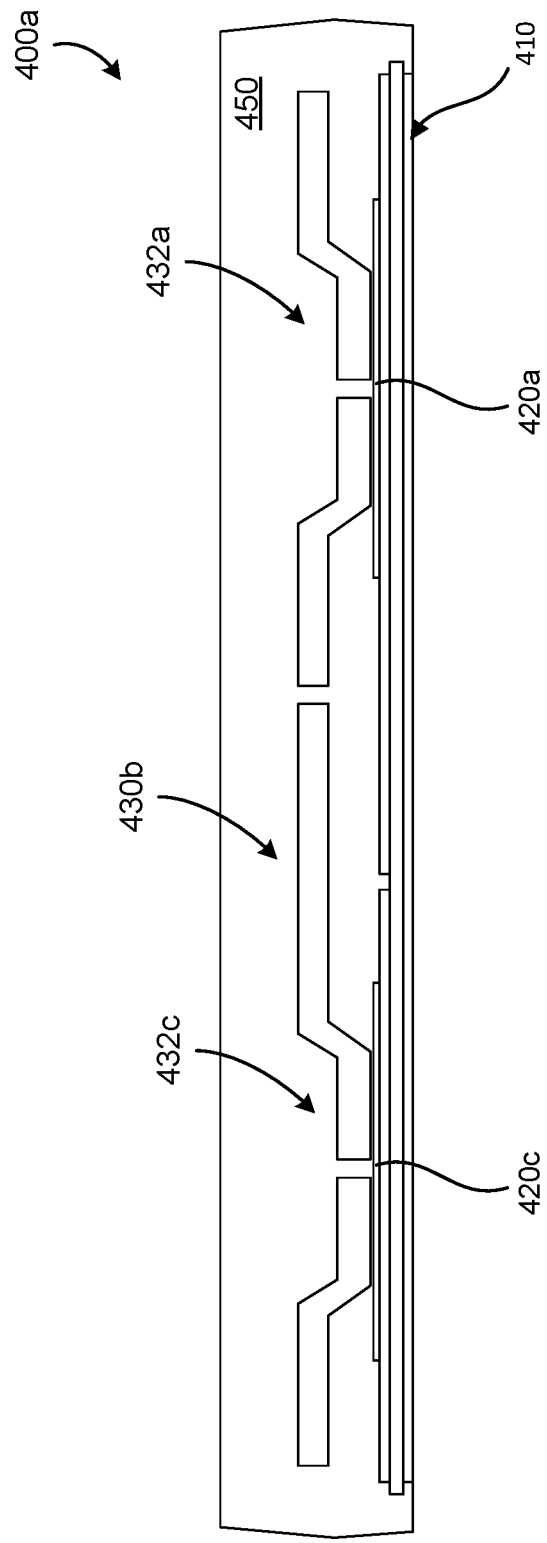

FIGS. 4A-4E are diagrams that illustrate various views and components of a multi-chip power semiconductor device package assembly. For instance, FIG. 4A illustrates a substrate assembly 410 for the multi-chip power semiconductor device package assembly (module). FIG. 4B illustrates an leadframe 430 for the package assembly. FIG. 4C illustrates an assembly 400 that includes the substrate assembly 410 of FIG. 4A and the leadframe 430 of FIG. 4B. FIG. 4D illustrates the package assembly 400a after molding compound encapsulation of the assembly 400 of FIG. 4C. FIG. 4E illustrates a cross-sectional view of the assembly 400a of FIG. 4D along the section line 4E-4E shown in FIG. 4C.

Referring to FIG. 4A, the substrate assembly 410 can be a DBM (e.g., a DBC) substrate assembly. As shown in FIG. 4A, the substrate assembly 410 can have a patterned metal layer disposed on a dielectric layer (not shown). As shown in FIG. 4A, the substrate assembly 410 can have a first semiconductor die 420a, a second semiconductor die 420b, a third semiconductor die 420c, and a fourth semiconductor die 420d. In this example implementation, the first semiconductor die 420a can be a first insulated-gate bipolar transistor (IGBT) and the second semiconductor die 420b can be a first diode (e.g., clamping diode) that are used to implement a low-side switch of a power transistor pair in the assembly of FIGS. 4A-4E. Further, the third semiconductor die 420c can be a second insulated-gate bipolar transistor (IGBT) and the fourth semiconductor die 420d can be a clamping diode (e.g., clamping diode) that are used to implement a high-side switch of the power transistor pair in the assembly of FIGS. 4A-4E.

The substrate assembly 410 can further include landing pads 460, where the landing pads are isolated (electrically isolated) portions of the patterned metal layer of the substrate assembly 410, and can be used as landing pads for buffer feet of the leadframe 430 of FIG. 4B. Still further, the substrate assembly 410 can include wire bonds 470 between the semiconductor die 420a and the substrate assembly 410, and between the semiconductor die 420c and the substrate assembly 410, where the wire bonds 470 (along with signal leads of the leadframe 430) can provide electrical connections to the IGBT devices of the semiconductor die 420a and 420c (e.g., with gate terminals, sense terminals, etc.).

Referring to FIG. 4B, the leadframe 430 of the package assembly of FIGS. 4A-4E is shown. In this example, the leadframe 430 includes a first leadframe portion 430a (e.g., including a first planar body) and a second leadframe portion 430b (e.g., including a second planar body). The leadframe 430 be can formed of copper, copper alloys, or any other appropriate conductive material. As illustrated in FIG. 4B, the first leadframe portion 430a can have a first indentation 432a and a second indentation 432b defined therein. Likewise, the second leadframe portion 430b can have a third indentation 432c and a fourth indentation 432d defined therein. In this example, the indentations 432a-432d can be used to couple the leadframe 430 (e.g., leadframe portions 430a and 430b), respectively, with the semiconductor die 420a-420d), such as discussed further below. Briefly, the leadframe 430, including its indentations and other features, can be formed using one or more metal working techniques, such as stamping, machining, chemical etching, and so forth.

As shown in FIG. 4B, the leadframe 430 (e.g., leadframe portions 430a and 430b) includes a plurality of buffer legs 434, such as the buffer legs 134 discussed above with respect to FIGS. 1-3. As shown in FIG. 4B, each of the leadframe portions 430a and 430b includes at least two buffer legs 434, which, as previously discussed, can act as mechanical stops with the substrate assembly 410 (e.g., when contacting landing pads 460), and, as a result, can control (define, establish, etc.) a BLT of solder used to couple the indentations 432a-432d with the semiconductor die 420a-420d.

The leadframe 430, in this example implementation, can include signal leads 480 that can be direct-lead attached to the substrate assembly 410 and provide electrical connections to the semiconductor die 420a and 420c through the wire bonds 470. The leadframe 430, in this example implementation, can further include an output terminal 490a, a negative (e.g., ground) power supply terminal 490b and a positive (e.g., Vdd) power supply terminal 490c.

In this example implementation, in the assembly 400 shown in FIG. 4C, the indentation 432a of the first leadframe portion 430a can be coupled (soldered) to an emitter terminal of the IGBT of the first semiconductor die 420a (e.g., the low-side transistor), while the indentation 432c can be coupled (soldered) to an emitter terminal of the IGBT of the third semiconductor die 420c. Further, the collector terminals of the IGBTs can be appropriately coupled with the patterned metal layer of the substrate assembly 410. Further, the diodes of the semiconductor die 420b and 420d can be coupled between the emitter and collector terminals of their respective IGBTs (of the semiconductor die 420a and 420b). As illustrated in FIG. 4C, the leadframe 430 can be disposed on the substrate assembly 410 to form the assembly 400. In some implementations, other semiconductor devices, and/or semiconductor device modules can be implemented in the package assembly implementations described herein.

Referring to FIG. 4D, a package assembly 400a is illustrated, where the assembly 400a can be produced by encapsulating a portion of the assembly 400 of FIG. 4C in a molding compound 450 (e.g., an epoxy molding compound). Such encapsulation can be performed using injection molding, transfer molding, gel molding, etc.

Referring to FIG. 4E, a cross-sectional view of the assembly 400a of FIG. 4D along the section line 4E-4E (as indicated in FIGS. 4C and 4D) is shown. That is, the cross-sectional view shown in FIG. 4E is a view of assembly 400a through the first semiconductor die 420a (the first IGBT), the first indentation 432a, the third semiconductor die 420c (the second IGBT) and the third indentation 420c, where the sectional view of FIG. 4E corresponds with the section line 4E-4E in FIG. 4C when viewed in a direction corresponding with the direction line CS in FIG. 4C. As can be seen in FIG. 4E, the semiconductor die 420a and 420c are disposed on the substrate 410, with the indentation 432a being coupled with the semiconductor die 420a, and the indentation 432c being coupled with the semiconductor die 420c. While not shown, a cross-section taken through the second semiconductor die 420b (the first diode), the second indentation 432b, the fourth semiconductor die 420d (the second diode), and the fourth indentation 432c would be similar to the cross-sectional view shown in FIG. 4E.

Figure 5:
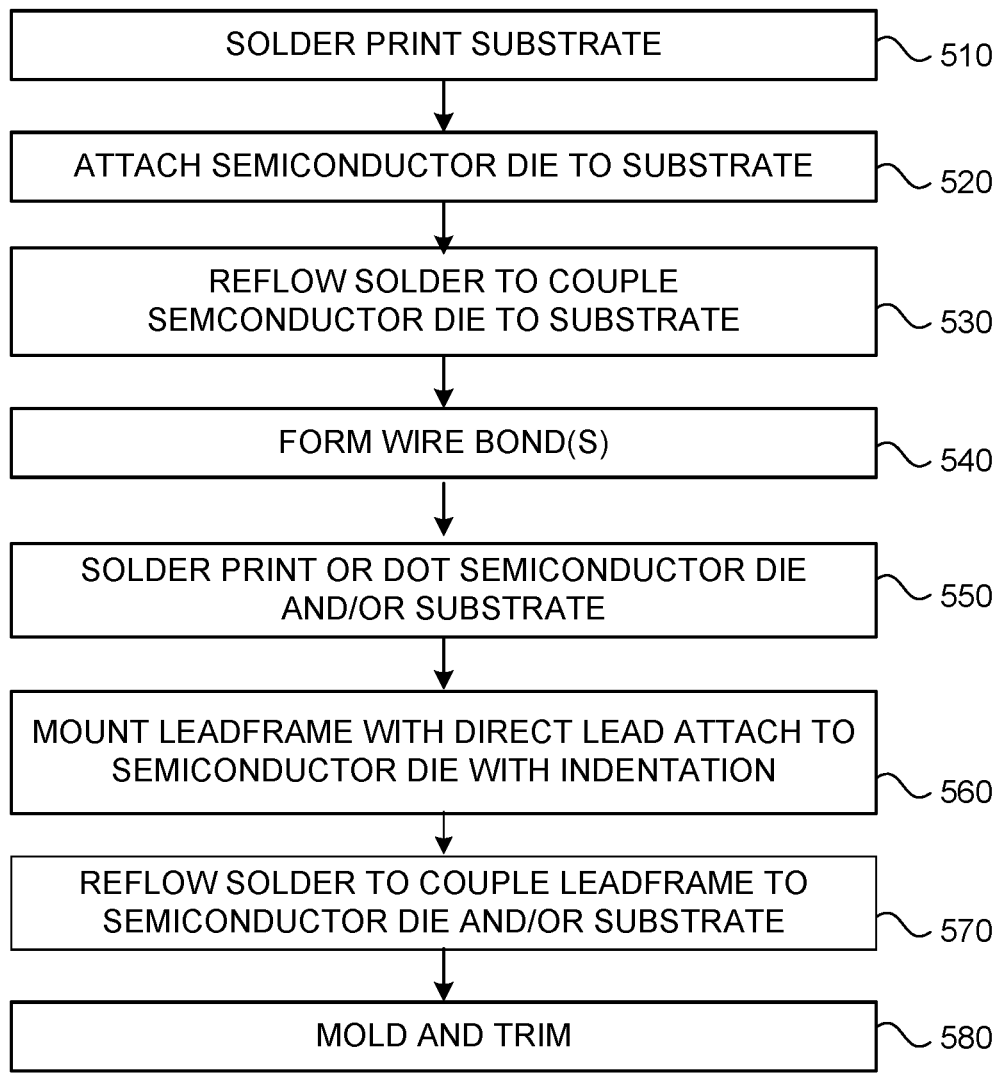
FIG. 5 is a flowchart that illustrates a method for manufacturing semiconductor device package assemblies, such as those described herein.

FIG. 5 is a flowchart that illustrates a method 500 for manufacturing semiconductor device package assemblies, such as the packages described herein. For purposes of illustration and by way of example, the method 500 will be described with further reference to the implementations of FIGS. 1 and 2A-2C. It will be appreciated, however, that the method 500 can be used to produced semiconductor device packages having other configurations, such as the example implementation of FIGS. 4A-4E, to which still further reference is made in the following discussion of FIG. 5.

As shown in FIG. 5, the method 500 (with reference to FIGS. 1 and 2A-2C), at block 510, includes solder printing (e.g., conductive adhesive 142) the substrate 110 for attachment of the semiconductor die 120. At block 520, the method 500 includes attaching the semiconductor die 120 to the substrate 110 (e.g., placing the semiconductor die 120 on the solder print of block 510). At block 530, the method 500 includes reflowing the solder of block 510 to couple the semiconductor die 120 with the substrate 110. In some implementations, the solder reflow operation of block 530 can be performed using a corresponding soldering jig.

At block 540, wire bonds (e.g., such as the wire bonds 470 shown in FIG. 4A) can be formed between the semiconductor die 120 and the substrate 110. For instance, wire bonds for gate terminal connections of an IGBT device, as well as other control and/or sense signals (e.g., temperature, emitter sense, etc.) can be formed at block 540. In some implementations, signal leads 480 can then be direct lead attached to the substrate to provide external electrical access to the semiconductor die through the wire bonds of block 540.

At block 550 of the method 500, a solder dotting or solder printing operation can be performed on the semiconductor die 120 (e.g., conductive adhesive 140) and/or the substrate 110 to define where electrical connections between the leadframe 130 and the semiconductor die 120, and/or electrical connections between the leadframe 130 and the substrate 120 will be defined. For instance, solder dotting for connection of the indentation 132 with the semiconductor die 120, for connection of signal leads with the substrate 110, etc. can be performed at block 550. At block 560, the leadframe 130 can be mounted on the semiconductor die 120 and the substrate 110 (e.g., using a soldering jig). Further at block 560, a bond line thickness of the conductive adhesive (solder) 140 can be controlled by the buffer legs 134 of the leadframe acting as mechanical stops against the substrate 110, such as described herein.

At block 560, the method 500 can include performing another solder reflow operation to couple (solder) the leadframe 130 (via the indentation 132) to the semiconductor die 120, and/or couple (solder) the leadframe 130 (e.g., the signal leads 480) to the substrate 110. It is noted that, as was discussed above, in the example implementations described herein, the buffer legs 134 are not soldered to (remain mechanically independent from) the substrate 110, such that the buffer legs 134 can move with respect to the substrate (e.g., move on the landing pads 460 shown in FIG. 4A in response to a force applied to the leadframe 130 by a soldering jig, as discussed with respect to FIG. 3). At block 570, mold and trim operations can be performed to encapsulate the package in the molding compound 150, remove any tie bars between signal leads, remove excess molding compound, etc., to complete assembly of the semiconductor device package.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package comprising:
   a substrate;
   a semiconductor die disposed on and coupled with the substrate, the semiconductor die being made of silicon carbide; and
   a leadframe including a planar body having an indentation disposed therein, the indentation defining a recess in the planar body, the recess defining an opening in the planar body, the opening having a continuous perimeter, at least a portion of the indentation being disposed on and coupled with the semiconductor die via a conductive adhesive,
   the indentation including:
      a first tab having a first contact surface coupled with the semiconductor die; and
      a second tab having a second contact surface coupled with the semiconductor die.

2. The semiconductor device package of claim 1, wherein:
   the indentation is defined in a body of the leadframe, the body of the leadframe being arranged in a first plane; and
   the first contact surface and the second contact surface being arranged in a second plane,
   the second plane being parallel with, and non-coplanar with the first plane.

3. The semiconductor device package of claim 2, wherein the first tab includes a sloped portion that is disposed between the body of the leadframe and the first contact surface, the sloped portion being sloped with respect to the first plane and the second plane.

4. The semiconductor device package of claim 1, wherein the first tab and the second tab define a gap between the first contact surface and the second contact surface.

5. The semiconductor device package of claim 1, wherein the leadframe includes a plurality of buffer legs, the plurality of buffer legs being configured to provide mechanical stops with the substrate to define:
   a spacing between the indentation and the semiconductor die; and
   a bond line thickness of solder coupling the indentation with the semiconductor die.

6. The semiconductor device package of claim 5, wherein the plurality of buffer legs are configured to mechanically contact a surface of the substrate to define the spacing and the bond line thickness, the semiconductor die being coupled with the surface of the substrate.

7. The semiconductor device package of claim 6, wherein the plurality of buffer legs are mechanically independent from the surface of the substrate.

8. The semiconductor device package of claim 1, wherein the conductive adhesive is a solder material.

9. The semiconductor device package of claim 1, wherein the substrate is a direct-bonded-metal substrate.

10. The semiconductor device package of claim 1, wherein the semiconductor die includes a power transistor.

11. A semiconductor device package comprising:
   a substrate;
   a first semiconductor die disposed on and coupled with the substrate, the first semiconductor die being made of silicon carbide;
   a second semiconductor die disposed on and coupled with the substrate, the second semiconductor die being made of silicon carbide;
   a leadframe including:
      a first leadframe portion including a first planar body having a first indentation disposed therein, the first indentation defining a recess that is wholly disposed within an interior of the first planar body, a contact surface of the first indentation being disposed on and coupled with the first semiconductor die; and
      a second leadframe portion including a second planar body having a second indentation disposed therein, the second indentation defining a recess that is wholly disposed within an interior of the second planar body, a contact surface of the second indentation being disposed on and coupled with the second semiconductor die; and conductive adhesive that:
   couples the contact surface of the first indentation with the first semiconductor die; and
   couples the contact surface of the second indentation with the second semiconductor die,
   the contact surface of the first indentation includes a first contact surface and a second contact surface, the first indentation including:
      a first tab including the first contact surface, the first tab being coupled with the first semiconductor die; and
      a second tab having the second contact surface, the second tab being coupled with the first semiconductor die.

12. The semiconductor device package of claim 11, wherein:
   the first semiconductor die includes a first power transistor; and
   the second semiconductor die includes a second power transistor.

13. The semiconductor device package of claim 11, further comprising:
   a third semiconductor die disposed on and coupled with the substrate;

a fourth semiconductor die disposed on and coupled with the substrate;

the first leadframe portion having a third indentation defined therein, a contact surface of the third indentation being disposed on and coupled with the third semiconductor die; and the second leadframe portion having a fourth indentation defined therein, a contact surface of the fourth indentation being disposed on and coupled with the fourth semiconductor die.

14. The semiconductor device package of claim 13, wherein the contact surface of the third indentation is coupled with the third semiconductor die and the contact surface of the fourth indentation is coupled with the fourth semiconductor die via the conductive adhesive.

15. The semiconductor device package of claim 13, wherein:

the first semiconductor die includes a first power transistor;

the second semiconductor die includes a second power transistor;

the third semiconductor die includes a first diode; and the fourth semiconductor die includes a second diode.

16. The semiconductor device package of claim 11, wherein the first tab and the second tab define a gap between the first contact surface and the second contact surface.

17. The semiconductor device package of claim 11, wherein:

the first indentation is defined in a body of the first leadframe portion, the body of the first leadframe portion being arranged in a first plane; and the contact surface of the first indentation being arranged in a second plane, the second plane being parallel with, and non-coplanar with the first plane.

18. The semiconductor device package of claim 17, wherein the first indentation includes a sloped portion that is disposed between the body of the first leadframe portion and the contact surface of the first indentation, the sloped portion being sloped with respect to the first plane and the second plane.

19. The semiconductor device package of claim 11, wherein the leadframe includes a plurality of buffer legs, the plurality of buffer legs being configured to provide mechanical stops with the substrate to define:

a spacing between the first indentation and the first semiconductor die;

a bond line thickness of the conductive adhesive coupling the first indentation with the first semiconductor die;

a spacing between the second indentation and the second semiconductor die; and a bond line thickness of the conductive adhesive coupling the second indentation with the second semiconductor die, the first leadframe portion including at least one buffer leg, and the second leadframe portion including at least one buffer leg.

* * * * *